United States Patent
Cuylen

Patent Number: 5,835,887
Date of Patent: Nov. 10, 1998

[54] PROCESS FOR THE RAPID DIGITAL ACQUISITION AND PROCESSING OF ANALOGUE MEASURED VALUES IN A PROCESSOR WITH RESTRICTED BINARY WORD LENGTH

[75] Inventor: Michael Cuylen, Zirndorf, Germany

[73] Assignee: Siemens Aktiengesellschaft, Munich, Germany

[21] Appl. No.: 836,622

[22] PCT Filed: Nov. 10, 1995

[86] PCT No.: PCT/DE95/01556

§ 371 Date: Aug. 22, 1997

§ 102(e) Date: Aug. 22, 1997

[87] PCT Pub. No.: WO96/15502

PCT Pub. Date: May 23, 1996

[30] Foreign Application Priority Data

Nov. 11, 1994 [DE] Germany .......................... 44 40 305.4

[51] Int. Cl.⁶ ...................................................... G06F 7/04
[52] U.S. Cl. .................. 702/189; 702/190; 364/724.011; 364/745.01
[58] Field of Search ..................................... 364/481, 483, 364/736.01, 745.01, 745.03, 571.01–571.04, 724.011, 724.014, 724.1; 341/118, 126, 138, 139, 143, 144, 155, 158; 324/115; 702/189, 190

[56] References Cited

U.S. PATENT DOCUMENTS

| 4,431,987 | 2/1984 | Whiteside | 341/118 |
| 4,847,794 | 7/1989 | Hrubes | 364/571.04 |
| 5,177,697 | 1/1993 | Schanen et al. | 364/571.04 |
| 5,594,439 | 1/1997 | Swanson | 341/118 |

FOREIGN PATENT DOCUMENTS

| 32 10 571 | 10/1989 | Germany . |
| 38 20 144 | 12/1989 | Germany . |
| 37 24 917 | 9/1994 | Germany . |
| 63-217816 | 9/1988 | Japan . |
| 10-64416 | 3/1989 | Japan . |
| 2122041 | 1/1984 | United Kingdom . |

OTHER PUBLICATIONS

H.B. Bemmann et al., Anwendung adaptiver Analog–Digital–Umsetzer ini der MeBtechnik, Nachrichtentech., Elektron, Berlin 37 (1987), pp. 10–11. Y Dec. 82.

Primary Examiner—John E. Barlow, Jr.
Assistant Examiner—Craig Steven Miller
Attorney, Agent, or Firm—Kenyon & Kenyon

[57] ABSTRACT

In acquisition devices for analog measured values (Ue1 . . . Uen), there is frequently the problem that the digital processor (P) of said devices has a restricted binary word length (WP), as compared with the word length (WP) of the measured values in digitized form (AMD(Uen)). To permit unmodified rapid acquisition and digital conditioning of the measured values (AMD(Uen)), binary factors (NF, KF, VF) are preferably provided separately for each measured value (AMD(Uen)), said factors (NF, KF, VF) being combined (Equation 3) to form an element (K) which is processed by the processor (P) at an update rate which is lower in comparison with a sampling rate which is used to update the measured values (AMD(Uen)). As a result, the processing speed of the processor can be increased. It is also advantageous to provide a binary displacement factor (VF), by means of which the element (K) is expanded in a counter and the product of the element (K) and the respective digitized measured value (AMD(Uen)) is expanded in a denominator. The binary displacement factor (VF) is selected in such a way that the digital combination of the product with the displacement factor (VF) in the denominator corresponds to a loading operation of higher-order bits of the product by the processor (P).

4 Claims, 1 Drawing Sheet

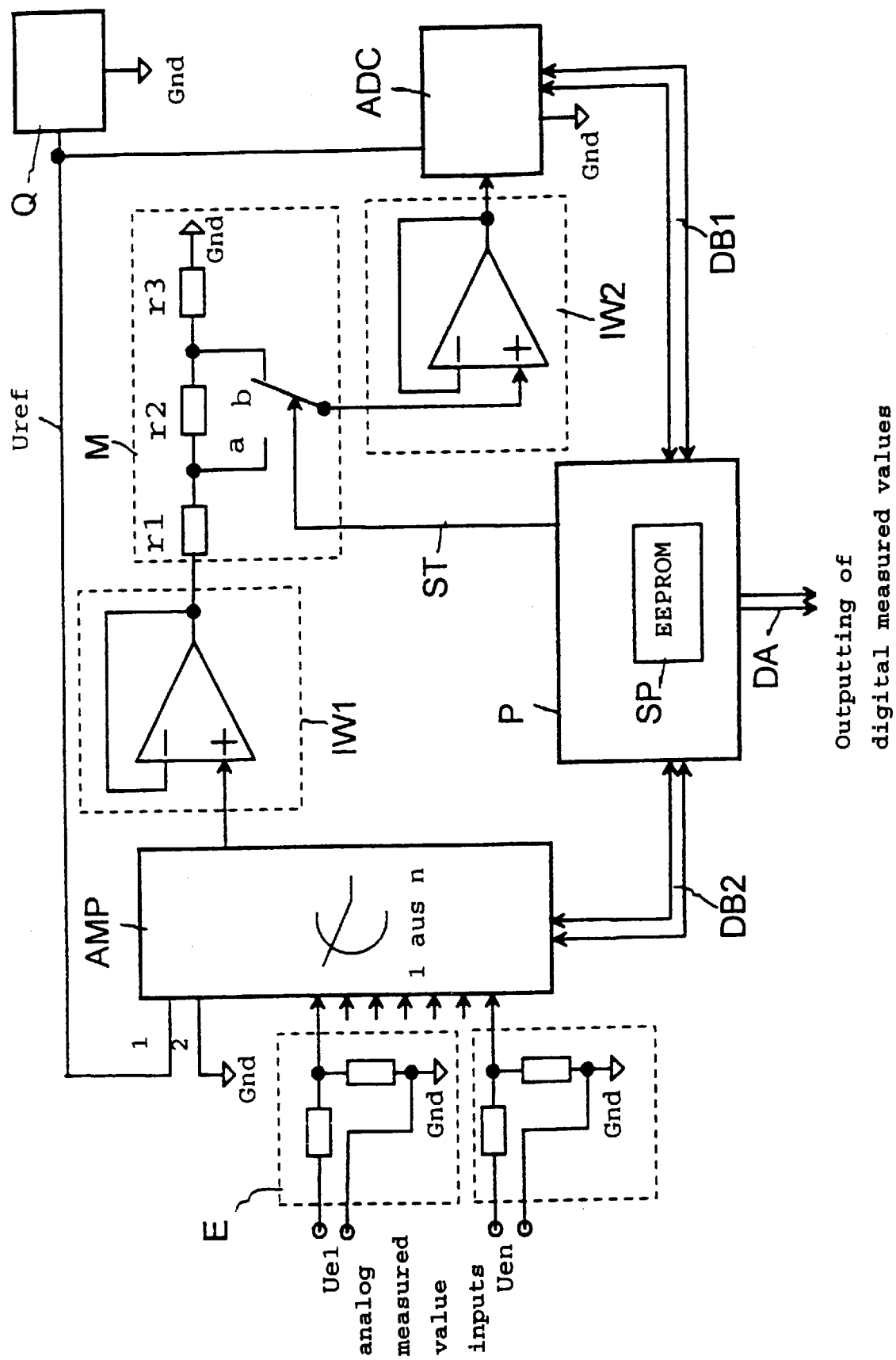

5,835,887

PROCESS FOR THE RAPID DIGITAL ACQUISITION AND PROCESSING OF ANALOGUE MEASURED VALUES IN A PROCESSOR WITH RESTRICTED BINARY WORD LENGTH

FIELD OF THE INVENTION

The present invention is directed to the problem that in a digital device which acquires and digitizes analog measured values, the digital processing unit has a smaller binary word length than the measured values to be processed. This problem occurs in particular if a cost-effective microprocessor with a small bus length has to be used as a digital processing unit.

BACKGROUND OF THE INVENTION

In digital measuring and process automation technology it is often necessary to acquire and further process analog values from a technical process under memory-programmable control. To this end, these analog measured values are sampled by so-called analog-value input assemblies with a fixed timing pattern, which is frequently referred to as a sampling cycle, and are then subjected to analog-to-digital conversion. In such cases, the measured values occur with a binary word length, for example of 16 to 32 bits, which is determined by the binary word length at the output of the analog-to-digital converter used and by the respective accuracy requirements. German Patent No. 32 10 571 describes an analog-to-digital converter device with an adaptation device for the analog signal fed to the analog-to-digital converter, with which adaptation device said signal can be amplified or attenuated by one level. In this way, the analog input signal is adjusted to the prescribed working range of the analog-to-digital converter used. Finally, a relationship is established between the resultant digital output signal and a digital signal which is simultaneously conditioned by means of a calibration device, as a result of which the amplification or attenuation of the analog input signal is corrected in terms of a measured range adaptation.

German Patent No. 38 20 144 describes a high-resolution A/D and D/A converter in which an amplifier with programmed amplification is connected upstream of the analog-to-digital converter. By appropriately selecting the amplifier stages, the maximum signal without reaching an overdrive level can be fed to the analog-to-digital converter. The input signal which is amplified by a specific factor in this way is multiplied, after conversion into a digital word, by the digital reciprocal value of the factor, so that the word length of the converted signal is increased. To this end, a corresponding number of amplifiers are connected in cascade and an A/D converter is connected to each amplifier output. The output signal of the amplifier which supplies the maximum signal without overdriving is fed by a selection switch to a multiplier. Finally the reciprocal value of the amplification of the amplifier chain which is connected upstream of the selected converter is fed to the multiplier.

For conditioning and further processing said measured values in digital measuring-technology systems, for reasons of cost processors are often used which have, in terms of hardware, only restricted word lengths. The binary word lengths of such processors are, as a rule, only 4, 8 or, at most, 16 bits. Thus, the problem arises that processing values, for example digital measured values which have been sampled from a technical process and have a binary word length of, for example, 16 bits, have to be further processed by a microprocessor which, in comparison, has a restricted binary word length, for example an internal data bus with only an 8-bit word length.

Such processing must therefore be carried out sequentially by the, for example, 16-bit "long" digital processing value being further processed in fragments by using a plurality of cycles of the processor. In offline systems, this computing time-intensive processing in blocks of "excess length" processing values is, as a rule, uncritical. However, propagation time problems occur in so-called online systems in which analog measured values, for example temperatures, pressures, displacement values and angular values, and much more, have to be acquired from a technical process, digitized and further processed, under certain circumstances, at a high sampling rate, as far as possible in real time. It is therefore necessary, when using a processor with a word length which is relatively small in comparison, to find a compromise between the different requirements of, on the one hand, accurate processing of processing values with a large binary word length and of, on the other hand, sufficiently rapid processing of the same. In fact, after their digitization, analog measured values must, as a rule, be subjected to conditioning before they can be released for further processing, i.e. can be fed as measured values to, for example, a sampling control system realized by program means. During this conditioning, scaling and correction of the digitized measured values is performed.

The scaling is a customary measurement range adaptation, i.e. the expansion or compression of the measurement range of a digitized measured value to a value range which is necessary as a function of the application. To this end, the digitized measured value must be multiplied by a "scaling factor" which can be formed according to different strategies. Such a digital multiplication takes up considerable computing time in a binary computing system. In addition to the prevailing peripheral condition that the binary word length of the processor doing the processing is restricted compared with the binary word length of the measured value to be processed, there is the condition that, when a multiplication is being carried out, only partial blocks of a measured value can be processed per processor clock cycle, i.e. a plurality of clock cycles have to be used for such an operation, during which cycles the processor is not available for other tasks.

The correction is a customary elimination of interference influences which are caused by the measured value acquisition system itself and which falsify the analog measured value. Such interference influences arise, for example in circuit components, which are used for adapting the measurement range of the analog measured values to an analog value range which is necessary for the purposes of satisfactory digitization. The interference influences are caused by short-term temperature-dependent signal drifting, long-term level shifts in the circuit due to aging, tolerances in characteristic values of components due to manufacture, and many other factors. Such interference influences which occur in analog value input assemblies give rise, between the input and the output of the entire system, to a so-called voltage offset of the respective measured value. In order to compensate said voltage offset, the measured value must be divided, after its digitization, by the correction factor. Such a division requires considerably more computing time in a binary computing system than the multiplication required for scaling. In addition to the prevailing peripheral condition that the binary word length of the processor is restricted compared with the word length of the measured value to be processed, there is the condition that, when a binary division is being carried out, in turn only partial blocks of the measured values can be processed per processor clock cycle, i.e. a plurality of clock cycles have to be used for such an operation, during which cycles the processor is not available for other tasks.

In order to condition it, a digital processing value, in particular an analog measured value after its digitization, is thus generally subjected to at least one digital multiplication and one digital division. If a present, analog measured value is designated in digitized form, for example with AMD, the derivation of a "conditioned" measured value KMD can be summarized as $$KMD = NF * AMD/KF \quad \text{(Equation 1)}$$

where AMD: analog measured value in binary form
NF: scaling factor in binary form
KF: correction factor in binary form
KMD: "conditioned" measured value in binary form.

SUMMARY OF THE INVENTION

An object of the present invention is to provide a method with which conditioning of a measured value, which conditioning requires at least one digital multiplication and one digital division approximately in accordance with Equation 1 above, can be carried out with optimum timing in a digital computing system. In particular, even if such measured values are acquired, for example, in a short sampling cycle in a digital sampling control system, it is to be possible, nevertheless, to condition each individual measured value before its further processing, for example in control algorithms and the like, by the processor of the system, which, according to the preconditions, has only a restricted binary word length, with such speed that the sampling cycle which is of the desired shortness is not adversely affected by this procedure.

According to the present invention, the binary multiplication and division are not carried out according to Equation 1 above. Instead, it has been found, according to the invention, that these operations can be dealt with considerably more easily in the binary computational space, i.e. using considerably fewer processor cycles, if Equation 1 has approximately the following form:

$$KMD = (NF*VF/KF) * (AMD/VF) \quad \text{(Equation 2)}$$

where AMD: analog measured value in binary form
NF: scaling factor in binary form
KF: correction factor in binary form
VF: displacement factor in binary form
KMD: conditioned measured value in binary form Equation 1 is thus expanded, in the form of Equation 2, by a binary displacement factor which is dependent on the design of the measured-value acquisition system and the type of processor used therein. This has the advantage that the product can now be separated by an advantageous conversion into two elements which are considerably easier to process in digital processors than the original Equation 1. This easier processability results on the one hand from the fact that the first element of the product of Equation 2, i.e., $$(NF*VF/KF) = K \quad \text{(Equation 3)},$$

which contains the binary elements of the scaling factor NF, correction factor KF and displacement factor VF, can, in practice, be considered, in a first approximation, to be a constant K. The present value of the correction factor KF, which is influenced in particular by the fluctuations in circuit signal levels caused by aging and temperature drift, changes, in practice, only over the long term while the present values of the scaling and displacement factors VF, NF can, in any case, be considered to be constant after the circuit has been activated. According to the present invention, it is therefore not necessary to calculate anew the first bracketed expression in Equation 2, i.e. the constant K according to Equation 3, always simultaneously with the second bracketed expression in Equation 2, i.e. the updating of a measured value AMD in synchronism with the sampling cycle. Instead, the constant K according to Equation 3 can be calculated anew with a considerably lower update rate or, under certain circumstances, even only in an event-controlled fashion. The processor is considerably relieved by this measure.

The following is obtained by combining Equations 2 and 3

$$(K*AMD)/VF \quad \text{(Equation 4)}$$

When a further, particularly advantageous refinement of the present invention is used, a considerable saving in computing time can be made during the processing of this quotient with each clock pulse of the sampling cycle, i.e. at every acquisition of an updated measured value AMD. In other words, if the displacement factor VF is selected skillfully, the division can be dispensed with in practice. This is the case according to the invention if it corresponds to the square of the binary value, which is acceptable as maximum possible value with the respective binary word length WP of the processor, increased by 1. If the processor has, for example, a word length of 8 bits, in this case the displacement factor constitutes a 9-bit word in which the highest order bit is occupied with a 1 and all the lower-order bits are occupied with a 0. In this embodiment of the invention, the division result is equivalent to the further processing of the higher order bits of the binary word in the counter of Equation 4, i.e. to the 8 higher-order bits of a 16-bit word or the 16 higher-order bits of a 32-bit word in the counter of Equation 4.

Where VF: binary displacement factor
WP: binary word length of the processor
WM: binary word length of the digitized measured values, and where there is compliance with a preferred value range $$1 < WM/WP \leq 2 \quad \text{(Equation 5)}$$

for the ratio between the binary word length WM of the processor and the binary word length WP of the digitized measured values, in this case the following is valid for the displacement factor VF $$VF = (2^{WP})^2 \quad \text{(Equation 6)}.$$

NUMERICAL EXAMPLE 1

WP=4 bit
WM=5 . . . 8 bit
$2^4 = 16$
$(2^4)^2 32 \ 16^2 = VF = 256.$

NUMERICAL EXAMPLE 2

WP=5 bit
WM=6 . . . 10 bit
$2^5 = 32$
$(2^5)^2 = 32^2 = VF = 1024.$

NUMERICAL EXAMPLE 3

WP=8 bit
WM=9 . . . 16 bit $2^8 = 256$ $(2^8)^2 = 256^2 = VF = 65536$.

NUMERICAL EXAMPLE 4

WP=16 bit

WM=17 . . . 32 bit $2^{16} = 65536$ $(2^{16})^2 = 65536^2 = VF = 4294967296$.

BRIEF DESCRIPTION OF THE DRAWING

FIG. 1 illustrates an analog value inputting system in accordance with the present invention.

DETAILED DESCRIPTION

The invention is explained below with reference to the example of a so-called "analog value inputting" which is illustrated in the figure and is used to acquire and digitize analog measured values Ue1 . . . Uen. The "acquisition chain" there starts on the side of the analog measured value inputs, to which, by way of example, in each case an analog voltage is fed as measured values Ue1 . . . Uen, for example from a technical process. An input circuit E contains for each measured value a signal converter for the purpose of a first pre-adaptation. These are realized in the figure, by way of example, as so-called signal level converters in the form of voltage divider circuits. In other embodiments, current/voltage converters, for example, may also be provided in the input circuit E per measured value. Via a second data bus DB2, which is used for channel selection and is controlled by a central microprocessor P, an adjoining analog multiplexer AMP successively switches through the outputs of the individual signal converters of the input circuit E and thus feeds the analog measured values Ue1 . . . Uen individually to the further conversion circuit.

The latter contains, according to the example illustrated in the figure, a reference voltage source Q which makes available, in stable form over a long time, an analog reference voltage Uref whose value, as opposed to a reference voltage designated by Gnd, is known precisely. Said reference voltage Uref is required as a uniform reference, in particular by the analog multiplexer AMP, the signal level converters in the input circuit E, a measurement range adaptation means M and an analog-to-digital converter ADC. The analog-to-digital converter ADC converts the analog measured value respectively switched through by the analog multiplexer AMP, and feeds the result of the digitization to the microprocessor P via a first data bus DPI. The microprocessor P conditions the measured values in their binary form using further data contained in a memory SP designated EEPROM. For conditioning, it may be advantageous if the present values of the reference voltage Uref of the reference voltage source Q and those of the reference voltage Gnd of the entire measurement circuit are available in digitized form in the memory SP. In order to acquire said values, the analog multiplexer AMP can be actuated by the processor P via the second data bus DB2 in such a way that the values of Uref and Gnd fed to the analog multiplexer at the inputs 1 and 2 are switched through and thus fed to the acquisition chain and can finally be stored in the memory SP as digital values at the output of the analog-to-digital converter ADC via the first data bus DB1.

During this conditioning, scaling which, under certain circumstances, is specific to each measured value, i.e. measurement range adaptation, takes place, as does a correction of interference influences which are caused by the actual components contained in the circuit in the figure. As already stated at the outset, this requires that the measured values read by the first data bus DB1 be subjected, in accordance with Equation 1 above, to a digital multiplication by a scaling factor NF and a digital division by a correction factor KF. According to the present invention, the microprocessor is operated in such a way that the operations which are necessary for conditioning measured values proceed with such speed that they do not result in the sampling rate, i.e. the speed of acquisition of updated values for the individual analog measured values Ue1 . . . Ue2, being restricted. This is explained in more detail below.

In the example illustrated in the figure, there are additionally arranged in the acquisition chain between the output of the analog multiplexer AMP and the analog-to-digital converter ADC a first impedance transformer IW1, a measurement range adaptation means M comprising a series circuit of three resistors r1, r2, r3 with selection switch and a second impedance transformer IW2. The selection switch of the measurement range adaptation means M has the positions a, b and is activated by the processor P via a control line ST as a function of the present measured value Uen. The microprocessor P also performs the present channel selection of the analog multiplexer AMP via the second data bus DB2 and the control of the analog-to-digital converter ADC via the first data bus DB1.

The components in the entire acquisition chain ranging from the input circuit E to the impedance transformers IW1, IW2, the resistors r1, r2, r3 in the measurement range adaptation means M and the analog-to-digital converter ADC are subjected to a multiplicity of interference influences, in particular to drifting from characteristic values and potentials due to tolerances, aging and temperatures. Said drifting must be acquired, preferably cyclically, by the microprocessor P and used to correct the measured values. Assuming that, in the present example, the processor P cyclically acquires the present values of the reference voltage Uref and of the reference voltage Gnd of the measurement circuit, which are fed to the analog multiplexer AMP at the inputs 1, 2, by appropriately actuating said analog multiplexer AMP via the second data bus DP2, the digitized values of said reference voltages Uref and Gnd are available in the microprocessor, it is possible with RFD: present binary value of the reference voltage Uref of the reference voltage source Q, and OFD: present binary value of the potential of the reference voltage Gnd of the measurement circuit to determine a correction factor KF of the measurement circuit in the figure and, under certain circumstances, a plurality of such correction factors KF(Uen) separately for each individual measured value Uen as $$KF(Uen) = RFD - OFD \qquad \text{(Equation 7)}$$

where KF(Uen): correction factor associated with a measured value Uen.

After these variables are inserted into Equation 1 above, while further taking into account Uen: exemplary analog measured value AMD(Uen): analog measured value Uen in binary form NF(Uen): associated scaling factor KMD(Uen): conditioned measured value in binary form the following is obtained $$KMD(Uen) = NF(Uen) * [AMD(Uen) - OFD]/KF(Uen) \qquad \text{(Eq. 8)}$$

After the inventive conversion according to Equation 2 is applied to the above Equation 8, the following is obtained:

$$KMD(Uen)=[NF(Uen)*VF/KF(Uen)]*[AMD(Uen)-OFD]/VF \quad \text{(Equation 9)}$$

Furthermore, if the values contained in the above numerical Example 3 are used as a basis for the word lengths of the processor P and of the digitized measured values AMD(Uen), according to the invention the following value is obtained for the binary displacement factor VF in this case:

$$VF=65536.$$

For the left-hand part of the product of Equation 9, the following applies:

$$NF(Uen)*65536/KF(Uen)=K \quad \text{(Equation 10)}$$

As already stated above, in practice, this part may temporarily, i.e. usually for the duration of a relatively large number of sampling cycles of the measured value AMD(Uen), be considered to be a constant K. It is thus not necessary always to calculate this variable anew simultaneously with the acquisition of an updated measured value Uen. According to the present invention the updating of said variable takes place at a considerably lower repetition rate, so that a particularly advantageous substantial relieving of the processor P can be achieved.

According to the exemplary preconditions, all the elements of Equation 10 have the binary measured values—word length of WP=16 bits. The result of this is that the multiplication of NF(Uen) by 65536 in the counter of Equation 10 yields a 32-bit word. When it is divided by KF(Uen), the result constitutes a 16-bit word and the remainder is also a 16-bit word. The constant K which is also required according to the above Equation 4 thus constitutes the first of these two 16-bit words, after elimination of the remainder.

After combination of Equations 9 and 10, the following is obtained:

$$KMD(Uen)=K*[AMD(Uen)-OFD]/65536 \quad \text{(Equation 11)}$$

The product of the 16-bit-wide constant K with the similarly 16-bit-wide bracketed expression in the counter of the quotient of Equation 11 is a 32-bit word. Owing to the advantageous selection according to the invention of the displacement factor VF=65536, the quotient can now no longer be determined using a multiplicity of processor cycles. Instead, the division by 65536 is equivalent to a situation in which it is only necessary to use the two higher-order bytes of the 32-bit word from Equation 11 in order to obtain, as the result, the conditioned measured value KMD(Uen) in binary form. The division, which is in fact extremely demanding in terms of computational time, in Equation 11 can thus be avoided according to the present invention and can be reduced to simple loading operations for the two higher-order bytes of the 32-bit word.

Also when determining the constant K in the processor P in accordance with Equation 10 above, considerable advantages are obtained when the method according to the invention is used. For example, the multiplication NF(Uen)*65536 does not have to be carried out in the counter in practice, either. Instead, the multiplication of the 16-bit word NF(Uen) by 65536 is equivalent to a situation in which the result produced is a 32-bit word whose two higher-order bytes correspond to the value of the original NF(Uen). Here also, the multiplication which is in fact demanding in terms of computing time can be avoided according to the invention and reduced to simple loading operations for the two higher-order bytes of the 32-bit word. The remaining division of this 32-bit word by KF(Uen) in Equation 11 does have to be carried out, but, according to the invention, it can be done with a considerably reduced repetition rate, since the elements of Equation 11 can be considered as being at least temporarily constant.

The binary values for RFD, OFD contained in the above Equations 7 to 11 in the form of the correction factor KF(Uen) can be derived from the analog values for the reference voltage Uref and the reference voltage Gnd in a manner which corresponds to the acquisition, digitization and conditioning of analog measured values AMD(Uen).

The present invention thus has the advantage that, with a processor P which, according to the preconditions, has a restricted word length, for example with a cost-effective 8-bit processor, analog values, which are converted into digital values with a relatively large word length, for example into 16-bit words, can be processed without restrictions in terms of accuracy or processing speed. Therefore, despite a processor with restricted word length, a high data throughput rate can be achieved, i.e. the analog measured values Ue1 . . . Ue2 at the input of the circuit in the figure can be read with an unchanged sampling rate.

What is claimed is:

1. A method for digital acquisition and conditioning of analog measured values in a measured value acquisition device having a digital processor with a binary word length which is smaller than a binary word length of digitized measured values, the digitized measured values corresponding to the analog measured values in digitized form, the method comprising the steps of:

a) providing at least one binary factor for a respective value of the digitized measured values;

b) forming a binary element with the processor at an update rate which is lower than a sampling rate which is used to acquire and condition the respective value, the binary element being formed by expanding the at least one binary factor by a binary displacement factor in a numerator;

c) conditioning the respective value by expanding a product of the binary element and the respective value by the binary displacement factor in a denominator; and d) selecting the binary displacement factor as a function of the binary word length of the processor in such a way that a digital combination of the product in the numerator with the binary displacement factor in the denominator corresponds to a loading operation of higher-order bits of the product.

2. The method of claim 1, wherein a binary scaling factor for measurement range adaptation, and a binary correction factor for compensating interference influences occurring in the measured value acquisition device are combined as factors for conditioning the respective value.

3. The method of claim 2, wherein the binary correction factor corresponds to a binary difference between a binary value of a first reference voltage and a binary value of a second reference voltage of the measured value acquisition device.

4. The method of claim 3, wherein the first reference voltage and the second reference voltage are acquired, digitized and conditioned by the measured value acquisition device in the same way as the analog measured values.

* * * * *